United States Patent [19]

Fletcher et al.

[11] 4,003,004

[45] Jan. 11, 1977

[54] FREQUENCY MODULATED OSCILLATOR

[76] Inventors: James C. Fletcher, Administrator of the National Aeronautics and Space Administration, with respect to an invention of; Martial A. Honnell, Auburn, Ala.

[22] Filed: Apr. 9, 1975

[21] Appl. No.: 566,495

[52] U.S. Cl. .................. 332/30 V; 331/114; 331/177 V; 332/18

[51] Int. Cl.[2] .................................. H03C 3/20

[58] Field of Search ............. 331/36 C, 177 V, 114; 332/30 V, 18, 37 R; 330/31; 334/15

[56] References Cited

UNITED STATES PATENTS

| | | | |
|---|---|---|---|
| 2,549,923 | 4/1951 | O'Brien | 331/176 |
| 3,020,493 | 2/1962 | Carroll | 331/114 |
| 3,440,544 | 4/1969 | Pampel | 331/36 C |
| 3,628,152 | 12/1971 | Carlson | 331/117 R |
| 3,795,870 | 3/1974 | Sanders | 331/117 R |
| 3,845,403 | 10/1974 | Heckman, Jr. | 330/31 |

*Primary Examiner*—John Kominski
*Attorney, Agent, or Firm*—L. D. Wofford, Jr.; G. J. Porter; John R. Manning

[57] ABSTRACT

A frequency modulated push-pull oscillator in which the non-linear characteristic of varactors producing frequency modulation is compensated for by an opposite non-linear characteristic of a field effect transistor (FET) providing modulating bias to the varactors.

8 Claims, 4 Drawing Figures

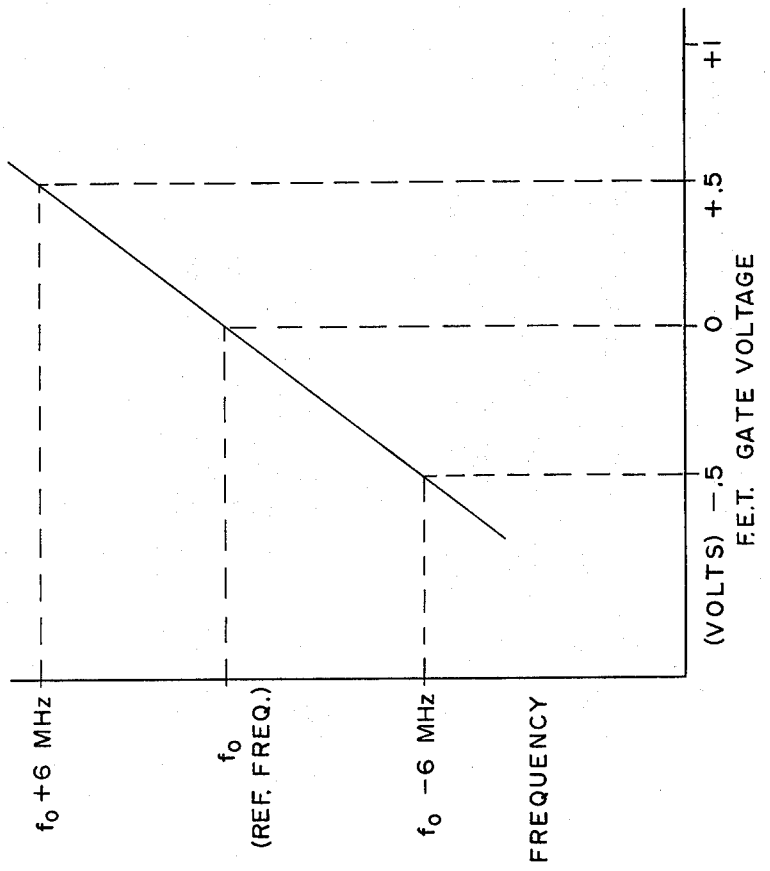
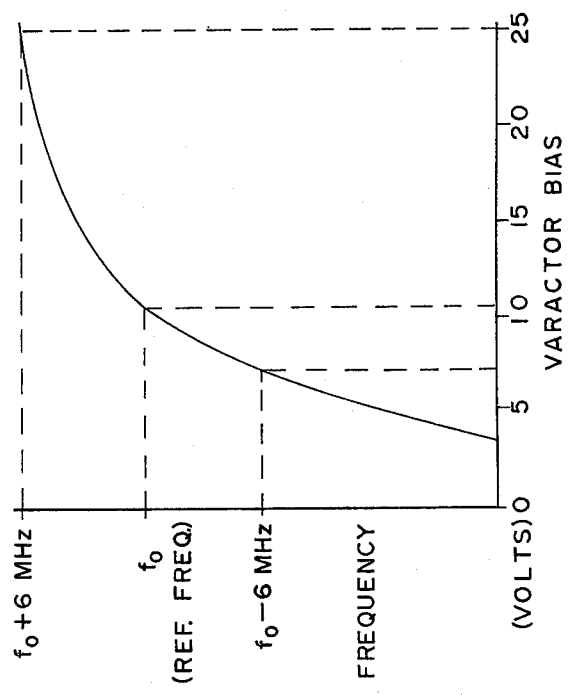
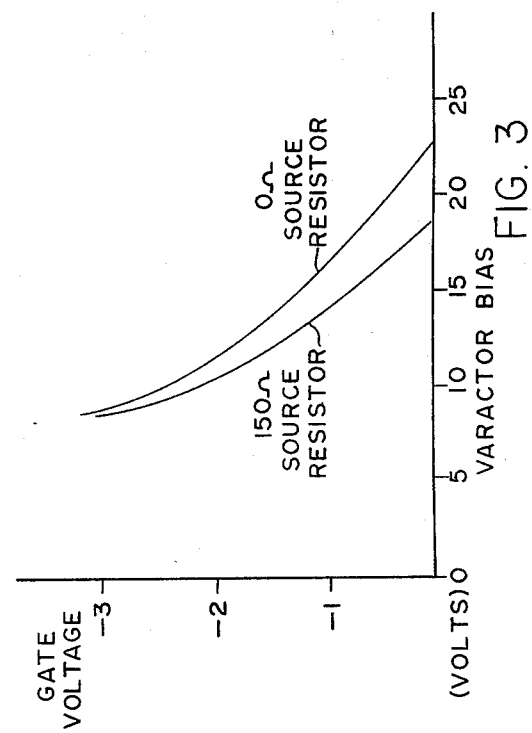

FREQUENCY MODULATED OSCILLATOR

ORIGIN OF THE INVENTION

The invention described herein was made in the performance of work under a NASA contract and is subject to the provisions of Section 305 of the National Aeronautics and Space Act of 1958, Public Law 85-568 (72 stat. 435; 42 U.S.C. 2457).

BACKGROUND OF THE INVENTION

1. Field of the Invention

This invention relates to radio frequency oscillators, and particularly to a frequency modulated oscillator having improved linearity over an extended modulation range.

2. General Description of the Prior Art

Frequency modulated transmitters for telemetry and television applications at S-band and higher frequencies require the use of an oscillator that can be modulated linearly in frequency over a wide range at high rates. Although the instantaneous frequency of the oscillator is varied at the modulation rate, the average frequency must be kept constant to very close tolerances. For speech and music modulation in which the average value of the modulating signal is zero, a closed-loop automatic-frequency-control (AFC) system provides an excellent means for stabilizing the frequency.

In systems where the information to be transmitted is in a well-defined, synchronous form, the frequency error can be corrected at specified times during transmission. For example, in a frequency-modulated television transmitter, the frequency can be stabilized during the horizontal blanking interval of the television signal. However, if the information to be transmitted is not conveniently synchronized, or if the system is to be used to transmit information in more than one format, the closed-loop arrangement may be impractical. Linearizing circuits have been used with varactor modulated oscillators in an effort to improve performance. These consist of several diodes and biasing voltages which provide a piecewise linear approximation of the desired correction curve. However, the circuits are highly temperature dependent and do not respond to high modulation frequencies.

For many telemetry applications, a system is desired which will generate and transmit information in any format, analog or digital, with a high degree of frequency stability, employing a frequency deviation as high as one percent of the microwave carrier frequency. Ideally, the oscillator would have a broadband modulation response extending from D.C. to several megahertz.

It is, accordingly, the object of this invention to provide an improved frequency modulated oscillator having these characteristics.

SUMMARY OF THE INVENTION

In accordance with the invention, an oscillator would be modulated by a varactor which would be fed its modulation signal through a field effect transistor. As a result, the inherently non-linear characteristic of this type transistor complements the non-linear characteristic of the varactor to provide an exceptionally linear overall frequency deviation response.

BRIEF DESCRIPTION OF THE DRAWINGS

FIG. 2 is a graph illustrating frequency deviation of the oscillator versus varactor bias.

FIG. 3 is a graph illustrating the input-output characteristic of a field effect transistor employed as a modulating signal amplifier and providing a modulation bias to varactors employed in the oscillator.

FIG. 4 is a graph illustrating the overall response of the oscillator as a function of an input modulation signal.

DETAILED DESCRIPTION OF THE DRAWINGS

Figure 1:
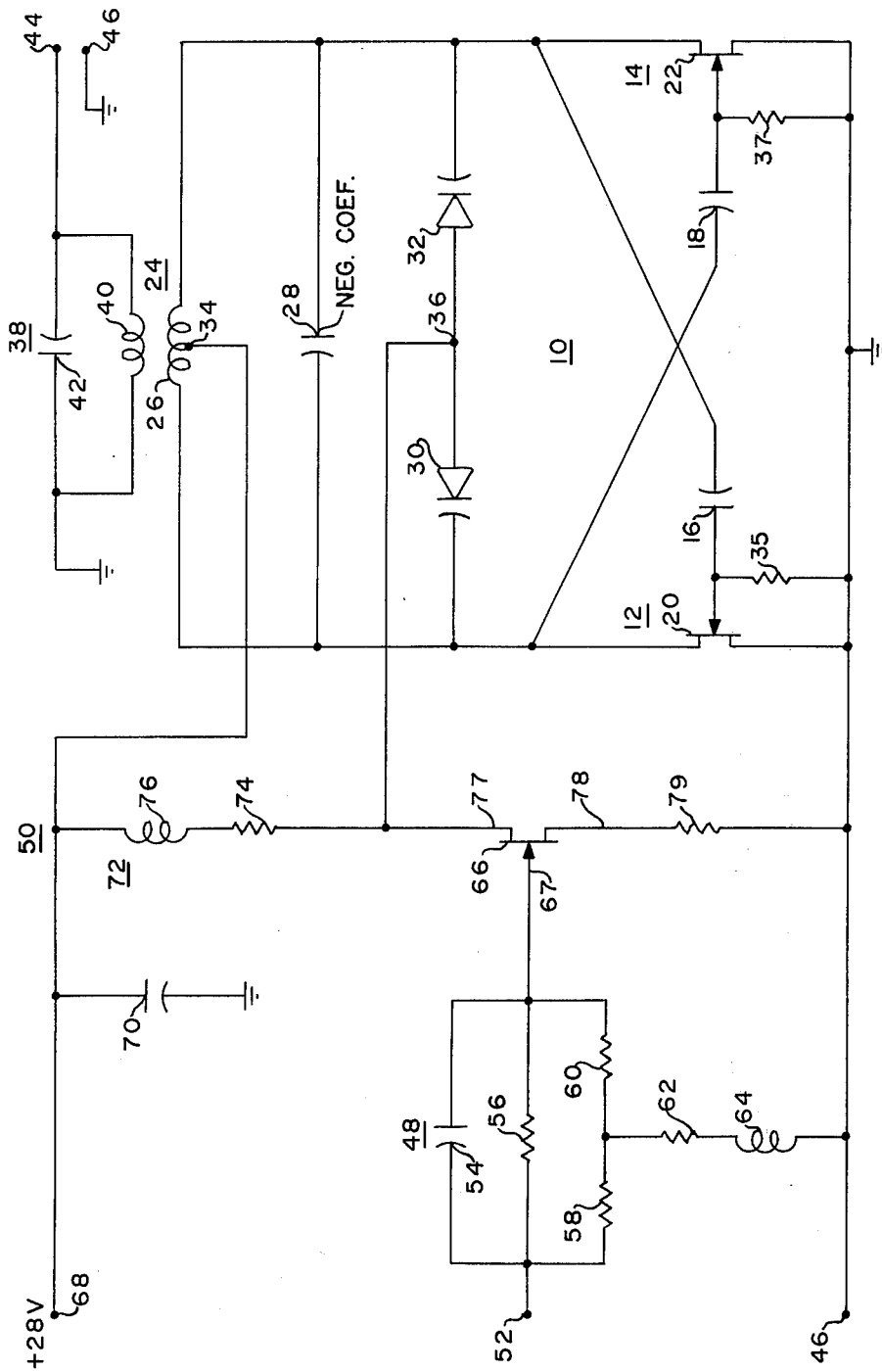
FIG. 1 is an electrical schematic diagram of an embodiment of the oscillator of this invention.

Referring to FIG. 1, push-pull oscillator 10 contains a first amplifier stage 12 and a second amplifier stage 14 connected input-to-output through feedback capacitors 16 and 18. Field effect transistors 20 and 22 are employed as the active elements of the amplifier stages. Parallel tuned circuit 24 is connected between the drain leads of transistors 20 and 22, and it is comprised of inductor 26, capacitor 28, and varactors 30 and 32. Inductor 26 is center tapped at point 34, thus providing a zero RF potential point for the application of one pole of a modulation voltage. Varactors 30 and 32 are connected back-to-back to terminal lead 36, which lead provides a second pole connection for the modulating voltage which is also at an electrical mid-point, a zero RF potential point. Gate leak resistors 35 and 37 and capacitors 16 and 18 provide the operating gate bias voltages for transistors 20 and 22. The output of oscillator 10 is conventionally provided by inductive coupling from inductor 26 to tuned output circuit 38, comprising inductor 40 and capacitor 42, the output appearing between RF output terminal 44 and ground lead 46.

The modulation stage consists of a bridge-T equilizer 48 and amplifier stage 50. The circuit input is connected between terminal 52 and ground lead 46. Equalizer 48 is conventional, having the function of extending the frequency response smoothly up to 10 megahertz. Other conventional types of equalizers may be employed to extend the frequency range. The top part of the T, or series portion of the equalizer, consists of parallel connected impedance units, being capacitor 54, resistor 56, and series connected resistors 58 and 60. The vertical, or parallel, portion of this circuit consists of series connected resistor 62 and inductor 64, being connected between the interconnection of resistors 58 and 60 and common ground lead 46.

As a particular feature of this invention, a field effect transistor, transistor 66, is employed as modulation amplifier 50 with its gate input lead 67 being fed from equalizer 48. Operating bias for both the modulation amplifier and amplifiers of the oscillator stages are supplied from a single source connected between plus 28 volts terminal 68 and ground lead 46, the source being stabilized by capacitor 70. Modulation amplifier 50 is biased through its load circuit 72, consisting of resistor 74 and inductor 76, which are in the drain lead 77 of transistor 66. Inductor 76 functions as a shunt peaking inductor to extend the high frequency response of amplifier 50. Source lead 78 of transistor 66 is connected through resistor 79 to ground lead 46. Bias from terminal 68 to field effect transistors 20 and 22 of oscillator 10 is fed to the drain lead of each of the transistors through inductor 26.

The modulation output signal of modulation amplifier 50, appearing across resistor 74 and inductor 76, is directly connected to oscillator 10 through center tapped connection 34 on inductor 26 and through a direct connection to varactor connection lead 36. Thus, by this configuration of connection, modulation voltage is applied to oscillator 10 at zero RF potential points in the output circuit of oscillator 10. Varactors 30 and 32 function conventionally to vary in capacitance with applied voltage to thereby vary the tuning and thus the frequency of oscillation of oscillator 10 as a function of input voltage applied between terminal 52 and ground lead 46.

FIG. 2 shows a plot of varactor bias voltage versus frequency deviation with respect to an operating frequency of 113 megacycles. It will be noted that the rate of frequency increase with increase in varactor bias voltage decreases as varactor bias voltage increases beyond a certain point.

FIG. 3 plots the input-output voltage characteristic of field effect transistor modulation amplifier 50 and shows a reverse characteristic at upper signal levels in which the rate of increase of drain output voltage increases with increase in input gate voltage. Drain resistor 74 and source resistor 79 are adjusted to yield optimum complementary curvature to linearize the frequency response.

FIG. 4 shows the overall frequency response of oscillator 10, plotting gate voltage versus output frequency and showing that an extremely linear modulation characteristic is obtained.

Temperature compensation of the oscillator is provided by employing a negative temperature coefficient capacitor as capacitor 28. Varactors 30 and 32 are effectively connected in parallel across resistor 74, thus reducing the bandwidth of field effect transistor 66. Inductor 76 and equalizer 48 compensate for this effect and extend the bandwidth.

The push-pull oscillator configuration produces a symmetrical output signal, minimizing all even order harmonics. Also, by virtue of the balanced circuit arrangement, points 34 and 36, being at ground potential, enable the modulation voltage to be applied between these points without employing radio frequency filters which would degrade the high frequency modulation response of the modulating amplifier stage 50.

Further, the varactor modulated oscillator utilizing the compensating FET amplifier offers the distinct advantage over crystal stabilized oscillators employing a feedback frequency control system in that it provides a response extending down in frequency to direct current response.

From the foregoing, it is to be appreciated that this invention provides a new and improved frequency modulated oscillator. It offers substantial advantages in many applications, as for example, in high quality signal generators and in telemetry, television, and other types of communications systems.

Having thus described my invention, what is claimed is:

1. A frequency modulated oscillator comprising:
    a radio frequency oscillator
    modulation means comprising a varactor coupled to said oscillator for varying the frequency of said oscillator non-linearly, deviating in a first direction of deviation from a linear variation with respect to a signal applied to said varactor; and
    signal means comprising a field effect transistor, and responsive to an input signal applied to said field effect transistor, for applying, as an output of said field effect transistor, a signal to said varactor which varies non-linearly in amplitude with respect to said input signal due to a non-linearity of said field effect transistor, deviating in a second, opposite, direction of deviation from a linear variation when compared with a deviation from linearity effected by said varactor;
    whereby the frequency of output of said oscillator varies substantially linearly with the amplitude of said input signal applied to said field effect transistor.

2. A push-pull frequency modulated oscillator comprising:
    a pair of amplifiers, each having an input and output terminal, the output terminal of one amplifier being connected to the input terminal of the other amplifier, and parallel tuned inductive and capacitive circuits connected between said output terminals of said amplifier, said capacitive circuit including a pair of varactors, commonly connected back-to-back at an electrical mid-point;
    modulation means comprising a pair of varactors connected back-to-back in said capacitive circuit for varying the frequency of said oscillator non-linearly, deviating in a first direction from a linear variation of frequency with respect to a signal applied to said varactors;
    signal coupling means for coupling a signal voltage to said varactors; and
    signal means comprising a field effect transistor deviating in a second and opposite direction and having an input circuit, an output circuit, and a load circuit in series with said output circuit, said load circuit being coupled to and providing said last-named signal voltage to said signal coupling means whereby the frequency of output of said oscillator varies substantially linearly with the amplitude of said input signal applied to said field effect transistor.

3. A push-pull frequency modulated oscillator as set forth in claim 2 wherein said inductive circuit includes an inductor having a center tap, and said signal coupling means comprises means for coupling said signal voltage between said center tap and said electrical mid-point.

4. A push-pull frequency modulated oscillator as set forth in claim 3 wherein each of said pair of amplifiers comprises a field effect transistor, the drain connection of each comprising a said output terminal, which output terminals are directly connected to and across said inductor.

5. A push-pull frequency modulated oscillator as set forth in claim 4 including biasing means connected across said first named field effect transistor and said load circuit of said signal means, in series, and said biasing means being also connected through said inductor across the drain and source connections of said field effect transistors of said pair of amplifiers.

6. A push-pull frequency modulated oscillator as set forth in claim 5 wherein said load circuit includes an inductor and resistor in series.

7. A push-pull frequency modulated oscillator as set forth in claim 6 wherein said capacitive circuit includes a negative coefficient capacitor.

8. A push-pull frequency modulated oscillator as set forth in claim 7 wherein said modulation means comprises circuit means connected to said input circuit for extending the high frequency response of signals applied to said input circuit of said modulation means.

* * * * *